(12) United States Patent
Nakashima et al.

(10) Patent No.: US 7,001,456 B2
(45) Date of Patent: Feb. 21, 2006

(54) APPARATUS AND METHOD FOR SUPPLYING CRYSTALLINE MATERIALS IN CZOCHRALSKI METHOD

(75) Inventors: Katsunori Nakashima, Tokyo (JP); Tatsuya Yabusame, Tokyo (JP); Fumio Yamanaka, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 32 days.

(21) Appl. No.: 10/829,231

(22) Filed: Apr. 22, 2004

(65) Prior Publication Data
US 2004/0226504 A1 Nov. 18, 2004

(30) Foreign Application Priority Data
May 16, 2003 (JP) .............................. 2003-138337

(51) Int. Cl.
*C30B 15/02* (2006.01)
*C30B 15/04* (2006.01)

(52) U.S. Cl. ..................... 117/33; 117/113; 117/208; 117/214

(58) Field of Classification Search ................. 117/33, 117/13, 208, 214
See application file for complete search history.

(56) References Cited

U.S. PATENT DOCUMENTS

| | | | |
|---|---|---|---|
| 4,036,595 A * | 7/1977 | Lorenzini et al. | 117/202 |
| 5,488,923 A * | 2/1996 | Imai et al. | 117/33 |
| 5,524,571 A * | 6/1996 | Kawasaki et al. | 117/213 |
| 5,900,055 A * | 5/1999 | Nagai et al. | 117/33 |
| 6,059,876 A * | 5/2000 | Yin et al. | 117/19 |
| 6,805,746 B1 * | 10/2004 | Moroishi et al. | 117/214 |
| 6,896,732 B1 * | 5/2005 | Fickett et al. | 117/208 |

FOREIGN PATENT DOCUMENTS

| | | | |
|---|---|---|---|
| GB | 2155806 | * | 10/1995 |
| JP | 09-208368 | | 8/1997 |
| JP | 11-236290 | | 8/1999 |

* cited by examiner

*Primary Examiner*—Robert Kunemund
(74) *Attorney, Agent, or Firm*—Clark & Brody

(57) ABSTRACT

In supplying crystalline materials in the Czochralski method, it is made use of an apparatus equipped with an inner vessel having an opening portion at the lower part or bottom thereof, which is to be charged with a granular solid material, an outer vessel containing the inner vessel therein with the function of sliding movement and thus closing the opening portion, and pull-up means for suspending the inner vessel and outer vessel in a manner causing them to ascend or descend, wherein the opening portion is opened through a sliding motion of the inner vessel or outer vessel for additional charging or recharging of the solid material into the molten material in the crucible, with the result that the molten material in the crucible can be prevented from splashing, the additional charging can be carried out in a static manner, the material cost becomes low and there is no risk of cracking due to rapid heating. Further, the productivity in silicon single crystal growing can be improved, the crucible can be used efficiently and the life of the furnace parts can be prolonged and, as a result, the cost of silicon single crystal growing can be markedly reduced.

13 Claims, 7 Drawing Sheets

APPARATUS AND METHOD FOR SUPPLYING CRYSTALLINE MATERIALS IN CZOCHRALSKI METHOD

BACKGROUND OF THE INVENTION

1. Field of the Invention

The present invention relates to an apparatus for supplying crystalline materials which is to be used in growing single crystals by the Czochralski method, and to a method of supplying crystalline materials which is to be employed in that apparatus. More particularly, it relates to an apparatus for supplying crystalline materials which is to be used for additional charging or recharging of a solid material to the molten material in a crucible in growing a silicon single crystal, and to a method of supplying crystalline materials which is to be employed in that apparatus.

2. Description of the Related Art

Generally, in growing silicon single crystals by the Czochralski method, the solid single crystalline silicon charged into a crucible as the initial charge is molten upon heating by a heater surrounding the crucible. After formation of a molten material in the crucible, a seed crystal held above the crucible is lowered until it is inserted into the molten material in the crucible, while the crucible is rotated in a fixed direction. The seed crystal is then pulled up while it is rotated in a given direction. A cylindrical silicon single crystal is thus grown following the seed crystal.

Used as the solid material to be charged into the crucible as the initial charge is polycrystalline silicon in various forms, such as rod-like, lump-like or granular forms. These forms are supplied singly or in combination and serve as the materials constituting the molten material for silicon single crystal growing.

In silicon single crystal growing by the Czochralski method, the melting of the solid material initially charged in the crucible results in a decrease in volume, so that the volume of the resulting molten material becomes too small as compared with the capacity of the crucible. If single crystal growing is carried out in such a condition, a decrease in productivity is unavoidable due to the insufficient quantity of the molten material.

For avoiding the decrease in productivity resulting from the above, it is necessary to secure a desired amount of the molten material by supplementing the deficiency in molten material. Thus, "additional charging" is carried out as a technique for additionally supplying the solid material after initial charging into the crucible.

Thus, this "additional charging" is a technique for increasing the amount of the molten material in the crucible by further adding the solid material to the molten material after melting of the solid material initially charged in the crucible. By applying this "additional charging", it becomes possible to efficiently utilize the capacity of the crucible used and thereby improve the productivity in silicon single crystal growing.

Further, in growing silicon single crystals by the Czochralski method, a solid material supplying technique called "recharging" is also employed. More specifically, this is a technique adding, to the molten material remaining in the crucible after growing and pulling up a first single crystal, the solid material in an amount corresponding to the decrease in an amount of the molten material.

In other words, this technique consists in increasing the number of crystals pulled up per crucible by reforming a given amount of the molten material in the crucible and repeating the pulling up of a single crystal.

Therefore, by employing "recharging", it becomes possible to attain cost reduction through efficient utilization of the crucible and to improve the productivity and thereby reduce the cost of growing silicon single crystals, like in the case of "additional charging" mentioned above.

However, the material supply by additional charging or recharging is made in the art by adding the solid material in granular form to the molten material in the crucible using a material feeding pipe inserted in the growing furnace. Therefore, problems arise; for example, the solid material additionally charged may damage the crucible or cause splashing of the molten material, or splashes of the molten material may adhere to the parts in the crucible and shorten the life thereof or adversely affect the process of single crystal growing.

Therefore, various proposals concerning additional charging or recharging have been made in the art. For example, in view of the fact that the quartz crucible is readily damaged on the occasion of recharging and this may readily cause dislocation during single crystal growing, Japanese Patent Application Laid-open No. 09-208368 proposes a method of supplying silicon materials by which silicon materials can be additionally supplied in a manner friendly to both the silicon melt surface and solidified surface, rapidly and without damaging the quartz crucible on the occasion of melting.

It is alleged that by the method proposed in the above-cited publication, the splashing of the molten material can be avoided and the productivity in silicon single crystal growing and the production yield can be improved.

Furthermore, since direct addition of the solid material to the material in the crucible causes splashing of the melt, a technology is employed which comprises allowing the surface of the melt remaining in the crucible after withdrawal of the initial single crystal to solidify to a certain extent, feeding the solid material onto the solidified surface, and then melting the same. In this case, it is necessary for the operator to visually observe the state of solidification of the melt surface. During such observation, the operator cannot conduct any other work, which will be a hindrance to productivity improvement.

Therefore, for lightening such restriction on operator's action and making it possible to strive for improvement in productivity, Japanese Patent Application Laid-open No. 11-236290 proposes an additional material charging system for use in single crystal pulling apparatus in which system the state of solidification of the melt surface is detected by means of a visual sensor. This additional material charging system will make it possible to lighten operator's work and allow the operator to conduct some other work and thereby improve the productivity.

SUMMARY OF THE INVENTION

Those methods for supplying silicon materials and those additional material charging systems which have been proposed in the art can indeed attain their respective objects as far as the productivity in silicon single crystal growing is concerned, but do not disclose any concrete structure of a material supplying apparatus which can avoid splashing of the molten material in the crucible and enables static additional charging of the solid material. It is therefore necessary to newly make investigations to develop concrete structure of such apparatus that can be employed in material supply in the Czochralski method.

Furthermore, when polycrystalline silicon rods are used as the solid material in additional charging or recharging, not only they are expensive as compared with granular polycrystalline silicon but also cracking may possibly occur because of their being heated rapidly in the crucible; in addition, a long time is required for the formation of the molten material. Therefore, it is effective to use granular polycrystalline silicon as the solid material to be additionally charged or recharged in lieu of polycrystalline silicon rods.

In view of the state of the art as discussed above, it is an object of the present invention to provide an apparatus for supplying crystalline materials in the Czochralski method and a method of supplying crystalline materials to be employed in operating that apparatus by which apparatus and method a granular solid material, which is less expensive and in no danger of cracking due to rapid heating, can be used for static addition on the occasion of additional charging or recharging while preventing the molten material in the crucible from splashing.

The present invention, which has been completed to accomplish the above object, consists in the apparatus for supplying crystalline materials in the Czochralski method as disclosed below under any of (1) to (3) and in the method of supplying crystalline materials in the Czochralski method as disclosed below under any of (4) to (7):

(1) An apparatus for supplying crystalline materials in the Czochralski method which is equipped with an inner vessel having an opening portion at the lower part or bottom thereof, which inner vessel is to be charged with a granular solid material, an outer vessel containing the said inner vessel therein with the function of sliding movement and thus closing the opening portion of it, and pull-up means for suspending the inner vessel and outer vessel in a manner causing them to ascend or descend, wherein the above-mentioned opening portion is opened through a sliding motion of the inner vessel or outer vessel for additional charging or recharging of the solid material into the molten material in the crucible.

(2) In the apparatus for supplying crystalline materials according to the invention, either a structure such that the inner vessel is equipped with a clamping member for stopping the ascending or descending thereof and the opening portion of the inner vessel is opened through a sliding motion of the outer vessel or a structure such that the outer vessel is equipped with a clamping member for stopping the ascending or descending thereof and the opening portion of the inner vessel is opened through a sliding motion of the inner vessel may be employed.

(3) In the apparatus for supplying crystalline materials according to the invention, the material constituting the inner vessel and outer vessel is desirably quartz, silicon carbide (SiC), or carbon coated with SiC. The risk of the molten material being contaminated can be eliminated by making them of such material.

(4) A method of supplying crystalline materials in the Czochralski method which comprises the step of inserting an inner vessel having an opening portion at the lower part or bottom thereof with sliding function against an outer vessel and filling the inner vessel with a granular solid material while the above-mentioned opening portion is closed, the step of suspending the inner vessel and outer vessel and causing them to descend until above a crucible located in the center of a growing furnace, the step of stopping the descending of either of the inner vessel and outer vessel to thereby cause either of the inner vessel and outer vessel to slide, and the step of opening the above-mentioned opening portion through the sliding motion of the inner vessel or outer vessel and thereby additionally charging or recharging the solid material into the molten material in the crucible.

(5) In carrying out the method of supplying crystalline materials according to the invention, either of the following two modes may be employed: the inner vessel is equipped with a clamping member for stopping the descending thereof so that the opening portion of the inner vessel may be opened through a sliding motion of the outer vessel to allow additional charging or recharging of the solid material into the molten material in the crucible, or the outer vessel is equipped with a clamping member for stopping the descending thereof so that the opening portion of the inner vessel may be opened through a sliding motion of the inner vessel to allow additional charging or recharging of the solid material into the molten material in the crucible.

(6) In carrying out the method of supplying crystalline materials according to the invention, it is desirable that the granular solid material to be charged into the inner vessel to constitute a lower layer portion close to the opening portion be a fine-granule material with a grain size of not larger than 25 mm. The reason is as follows.

When the fine-granule material is filled into the inner vessel as the lower layer portion and then added to the molten material with its surface not yet solidified in the initial stage of addition, splashing of the molten material will not occur if the distance between the site of addition and the melt surface is adjusted. Further, the surface temperature of the molten material lowers and the melt surface solidifies as the addition of the solid material is continued and, therefore, the addition of the solid material onto the solidified melt surface will not cause splashing of the molten material irrespective of grain size.

(7) Further, in carrying out the method of supplying crystalline materials according to the invention, it is desirable that the solid material be additionally charged or recharged into the molten material in the crucible while the crucible is rotated. This makes it possible to uniformly distribute the additionally charged or recharged solid material in the crucible and thereby increase the amount of the solid material that can be fed at the same time.

The "granular solid material" so referred to herein is a polycrystalline silicon material whose grain size is within the range of 5 mm to 45 mm. Such a "granular solid material" with a grain size of not larger than 25 mm is filled in the lower layer part in carrying out the method of supplying crystalline materials according to the invention, as set forth above under (6), because splashing of the molten material in the crucible can be surely prevented in the initial stage of additional charging or recharging, as described above.

BRIEF DESCRIPTION OF THE DRAWINGS

FIG. 1 is a section view illustrating the overall structure of a single crystal growing furnace with an apparatus for supplying crystalline materials of present invention disposed therein. Thus.

FIG. 3 is a partial detailed illustration of the first structure example of the material vessel to be used in the apparatus for supplying crystalline materials according to the invention. Thus.

FIG. 4 is a partial detailed illustration of a second structure example of the material vessel to be used in the apparatus for supplying crystalline materials according to the invention. Thus.

DESCRIPTION OF PREFERRED EMBODIMENTS

In the following, preferred embodiments of the invention are described in detail referring to the accompanying drawings.

Figure 1A:
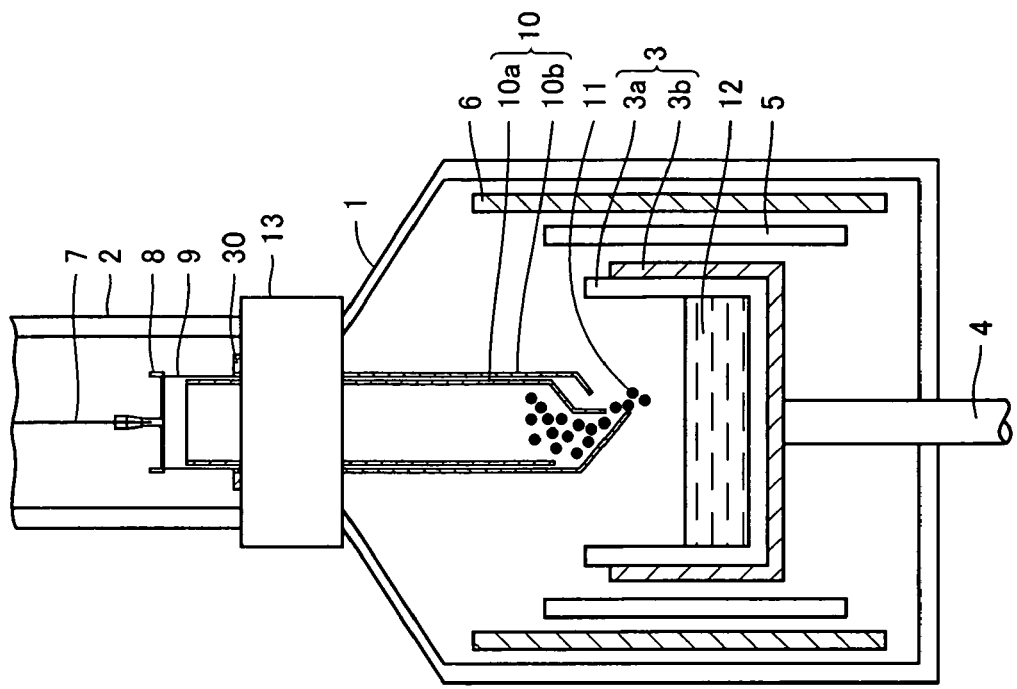
FIG. 1A shows the state of a material vessel filled with a granular solid material.
Figure 1B:
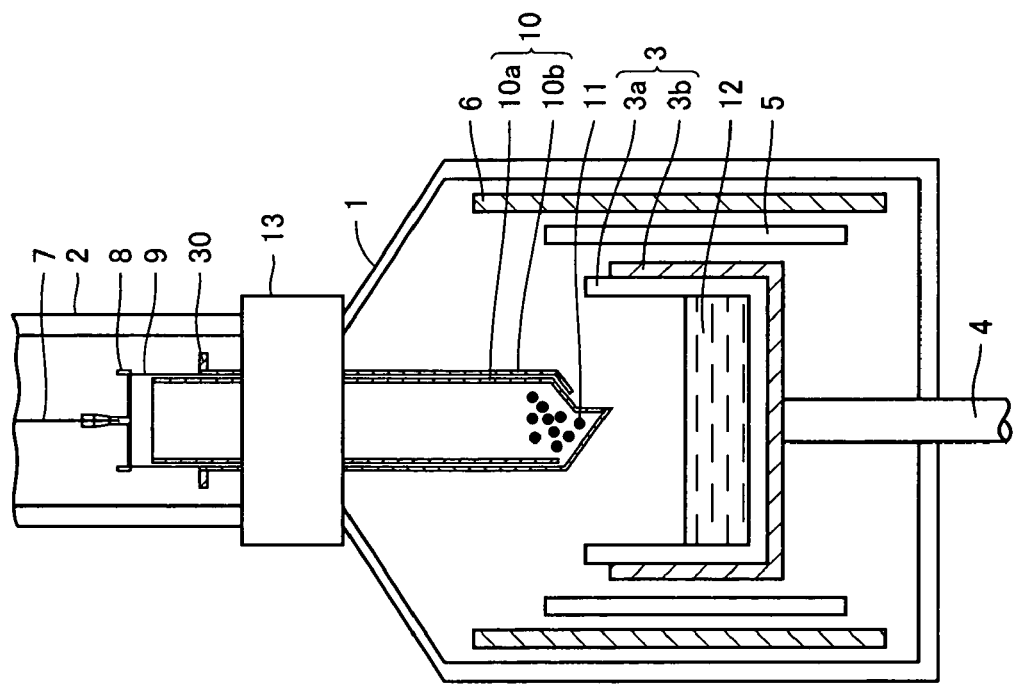
FIG. 1B shows the state of addition of the solid material to the melt.

FIG. 1 is a section view illustrating the overall structure of a single crystal growing furnace with an apparatus for supplying crystalline materials of present invention disposed therein. Thus, FIG. 1A shows the state of a material vessel filled with a granular solid material, and FIG. 1B shows the state of addition of the solid material to the molten material in the crucible.

As shown in FIG. 1A, the growing furnace to be used in the Czochralski method comprises a main chamber 1 and a pull chamber 2, which constitute the furnace body, and is further provided with a gate valve 13. The pull chamber 2 has a cylindrical shape smaller in diameter than the main chamber 1 and is disposed above the main chamber 1 coaxially therewith via the gate valve 13.

The gate valve 13 is disposed for enabling the operation for interconnection of the inside of the main chamber 1 with the inside of the pull chamber 2 or cutting off the interconnection. The gate valve 13 has a connecting hole whose diameter is smaller as compared with the pull chamber 2.

In the middle of the main chamber 1, there is disposed a crucible 3. This crucible 3 has a double-wall structure comprising an inner quartz crucible 3a and an outer graphite crucible 3b and is held via a crucible holder (not shown) called pedestal on a supporting shaft 4. The supporting shaft 4 is driven to cause the crucible 3 to ascend or descend in the axial direction and/or rotate in the circumferential direction.

A heater 5 is disposed around the crucible 3. Further, externally to the heater 5, there is disposed a heat insulator 6 along the inner wall of the main chamber 1.

Polycrystalline silicon in any of various forms such as rod-like, lump-like and granular forms is used as the solid material to be fed to the crucible 3 as an initial charge. It is melted by heating by means of the heater 5 to form a molten material 12. After melting of the solid material initially charged, additional charging is carried out to make up the deficiency resulting from melting and secure a desired amount of the molten material 12 in the crucible 3.

For this purpose, a pulling shaft 7 is hanged down in the pull chamber 2, and a material vessel 10 for use in the apparatus for supplying crystalline materials according to the invention is suspended on the pulling shaft. On that occasion, the material vessel 10 filled with a solid material 11 is suspended on a hanger 8 connected to the lower end of the pulling shaft via wires 9 and is positioned above the crucible 3 with a molten material 12 formed therein. The pulling shaft 7 is rotated and moved up or down by means of a driving mechanism (not shown) disposed at the uppermost part of the pull chamber 2.

Figure 2:
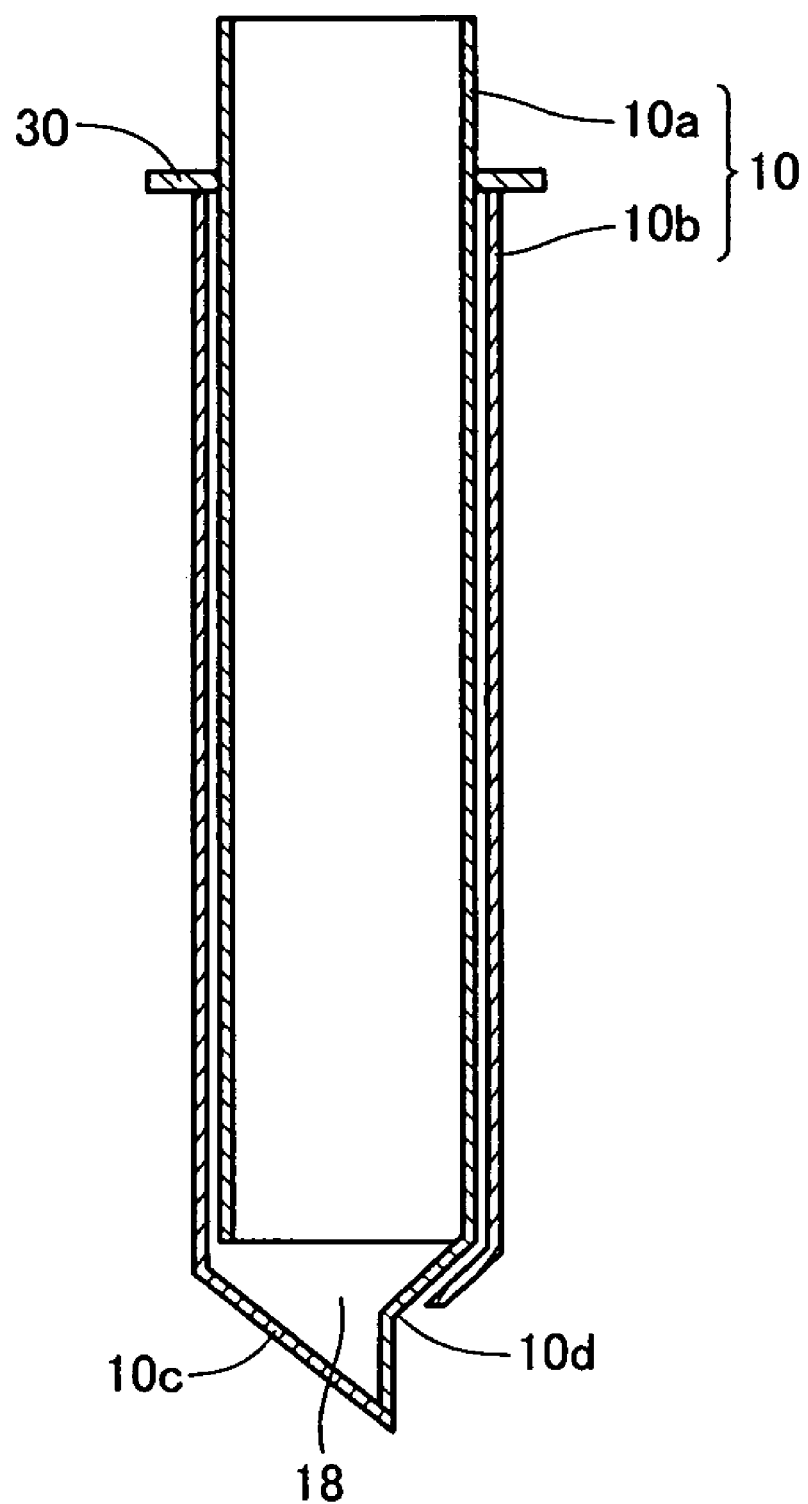
FIG. 2 is a representation of a first structure example of the material vessel to be used in the apparatus for supplying crystalline materials according to the invention.

FIG. 2 is a representation of a first structure example of the material vessel to be used in the apparatus for supplying crystalline materials according to the invention. The material vessel 10 is a cylindrical body with a double structure comprising an inner vessel 10a and an outer vessel 10b and is made of quartz. The outside diameter of the inner vessel 10a is smaller than the inside diameter of the outer vessel 10b, the inner vessel 10a is inserted into the outer vessel 10b, and both are made so that they can slide on each other.

In the first structure example shown in FIG. 2, the inner vessel 10a is equipped with a clamping member 30 and is inserted into the outer vessel 10b so that this clamping member 30 may be located at the upper end of the outer vessel 10b. The outer vessel 10b is held by a wire (not shown) and suspended on the pulling shaft mentioned above.

Figure 3A:
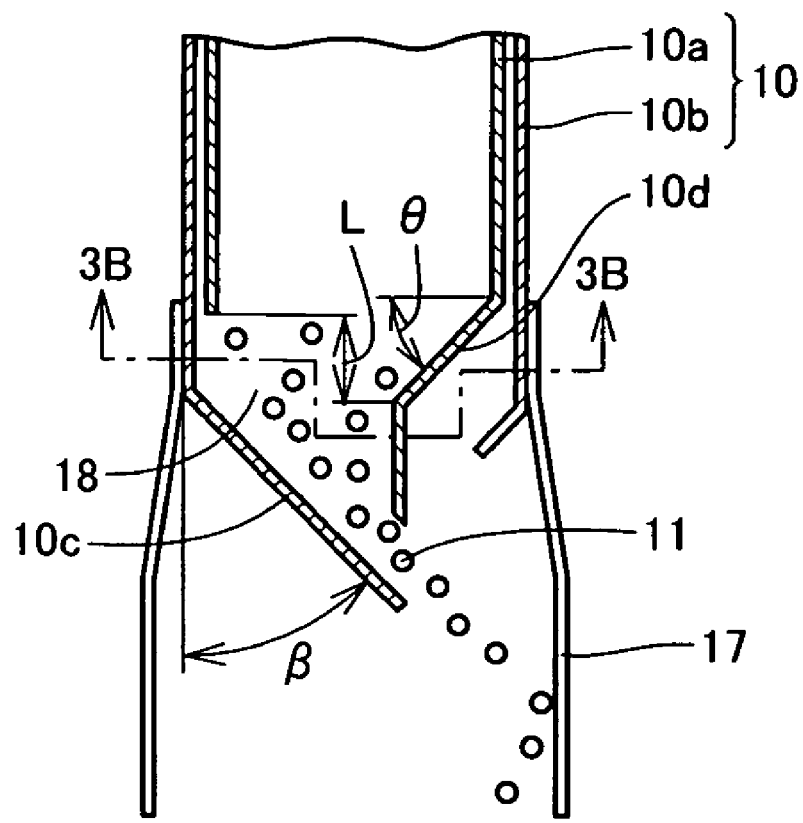
FIG. 3A is a vertical section view illustrating the lower layer structure of the material vessel which has an opening portion.
Figure 3B:
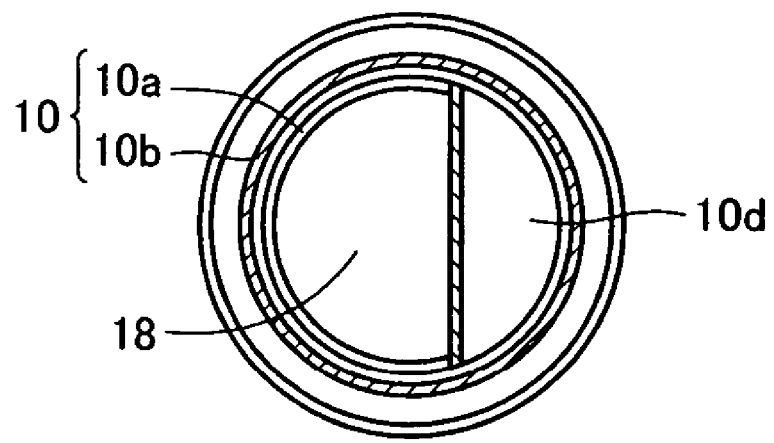
FIG. 3B is a section view illustrating the bottom feature of the material vessel, as seen in the direction of the arrows 3B—3B.

FIG. 3 is a partial detailed illustration of the first structure example of the material vessel to be used in the apparatus for supplying crystalline materials according to the invention. Thus, FIG. 3A is a vertical section view illustrating the lower layer structure of the material vessel which has an opening portion, and FIG. 3B is a section view illustrating the bottom structure of the material vessel, as seen in the direction of the arrows 3B—3B.

As shown in FIG. 3, an opening portion 18 for charging the solid material 11 into the crucible is provided at the bottom of the inner vessel 10a. While the solid material 11 is not charged, this opening portion 18 is closed by a closing member 10c of the outer vessel 10b and a closing member 10d of the inner vessel 10a. While the opening portion 18 is closed in such a manner, the solid material 11, which is polycrystalline silicon in a granular form, is filled into the inner vessel 10a through the upper opening portion.

In case the solid material 11 is charged preferentially toward the circumference of the crucible when it is added to the molten material in the crucible, a cover 17 may be disposed at the lower end part of the outer vessel 10b, as shown in FIG. 3A. This can solve the problem of unbalanced charging of the solid material 11 and can also serve to prevent the melt from splashing onto the heater 5 and other parts.

Referring to FIGS. 1 to 3, the operation procedure for additional charging using the first structure example of the material vessel is now described. After completion of melting of the initially charged solid material 11 in the crucible 3, the material vessel 10 with the solid material 11 filled therein and suspended on the hanger 8 connected to the lower end of the pulling shaft 7 via the wires 9 is positioned above the crucible 3 containing the molten material 12 formed in advance. The molten material 12 in the crucible 3 is insufficient as compared with the capacity of the crucible.

As shown in FIG. 2, the material vessel 10 is lowered and, when the clamping member 30 of the inner vessel 10a comes into contact with a small-diameter portion disposed at a predetermined height level, for example with the gate valve 13, the inner vessel 10a alone is stopped from descending. On the other hand, the descending motion of the outer vessel 10b held by the wires 9 is not hindered, hence the outer vessel 10b alone further descends from that position while sliding on the circumferential surface of the inner vessel 10a.

With the sliding motion of the outer vessel 10b, the opening portion 18 of the inner vessel 10a is opened, as shown in FIG. 3A, upon which the granular solid material 11 filled in the inner vessel 10a falls under its own weight and is charged into the molten material 12.

On that occasion, it is desirable that the lower layer portion, close to the opening portion 18, of the solid material 11 filled in the inner vessel 10a consists of fine grains of the material with a grain size of not larger than 25 mm. First, in the initial stage of additional charging, when the surface of the molten material 12 is not yet solidified, that portion of the granular material which is small in grain size is charged from the inner vessel 10a. At this point in time, the grain size of the granular material is small, so that the molten material 12 will not splash if the charging distance from the melt surface is adjusted, for example, to 100 mm or shorter from the melt surface.

As the charging of the solid material 11 is continued, the surface temperature of the molten material 12 lowers and the melt surface solidifies. Thereafter, the solid material 11 is added onto the solidified melt surface, hence the charging of the solid material 11 will not cause splashing of the molten material in the crucible on the heater 5 and other parts, irrespective of grain size.

In addition, granular polycrystalline silicon is used as the solid material 11 to be charged and, accordingly, the material cost required for additional charging is low. Furthermore, there is no risk of cracking due to rapid heating, so that the additional charging can be carried out efficiently.

After completion of the charging of the solid material 11, the material vessel 10 is pulled up and taken out of the pull chamber 2. In case the amount of the molten material in the crucible 3 fails to reach the desired level, the solid material 11 is repeatedly charged using another material vessel 10.

After completion of the additional charging and arrival of the amount of the molten material 12 in the crucible 3 at the target level, a seed crystal is suspended, in lieu of the material vessel, on the hanger 8 connected to the lower end of the pulling shaft 7 and the single crystal growing process is started.

While the above description is concerned with the operational procedure for additional charging, the same operational procedure can be employed in the case of recharging as well; after growing of the first single crystal, the granular solid material 11 corresponding in amount to the decrease in molten material is added to the molten material 12 remaining in the crucible 3.

Figure 4A:
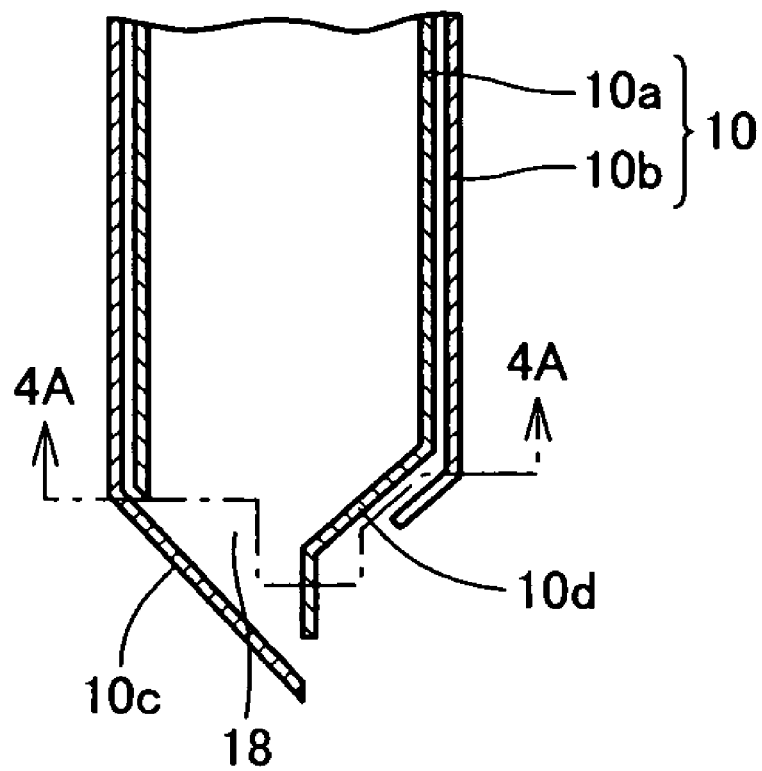
FIG. 4A is a vertical section view illustrating the lower layer structure of the material vessel which has an opening portion.
Figure 4B:
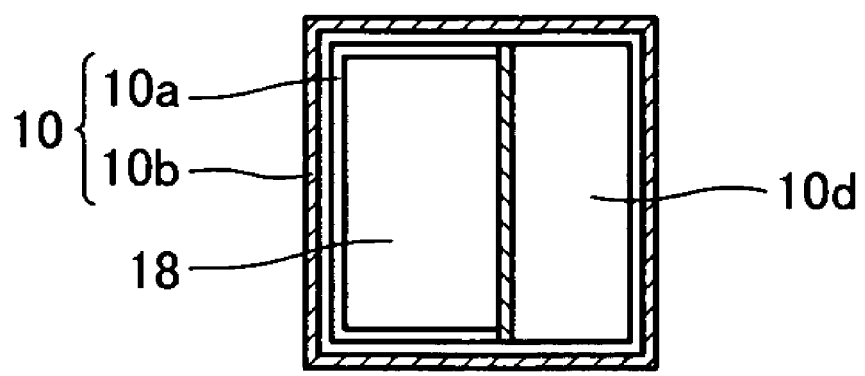
FIG. 4B is a section view illustrating the bottom structure of the material vessel, as seen in the direction of the arrows 4B—4B.

FIG. 4 is a partial detailed illustration of a second structure example of the material vessel to be used in the apparatus for supplying crystalline materials according to the invention. Thus, FIG. 4A is a vertical section view illustrating the lower layer structure of the material vessel which has an opening portion, and FIG. 4B is a section view illustrating the bottom structure of the material vessel, as seen in the direction of the arrows 4B—4B.

In the second structure example shown in FIG. 4, the material vessel 10 is a double square or rectangular tubular body, and the inner vessel 10a is inserted into the outer vessel 10b. Both are constituted so that they can slide on each other.

The opening portion 18 on the bottom of the inner vessel 10a is closed by a closing member 10c of the outer vessel 10b and a closing member 10d of the inner vessel 10a. While the opening portion 18 is in a closed state, the solid material 11 consisting of grains of polycrystalline silicon is filled into the inner vessel 10a through the upper opening thereof.

Figure 5:
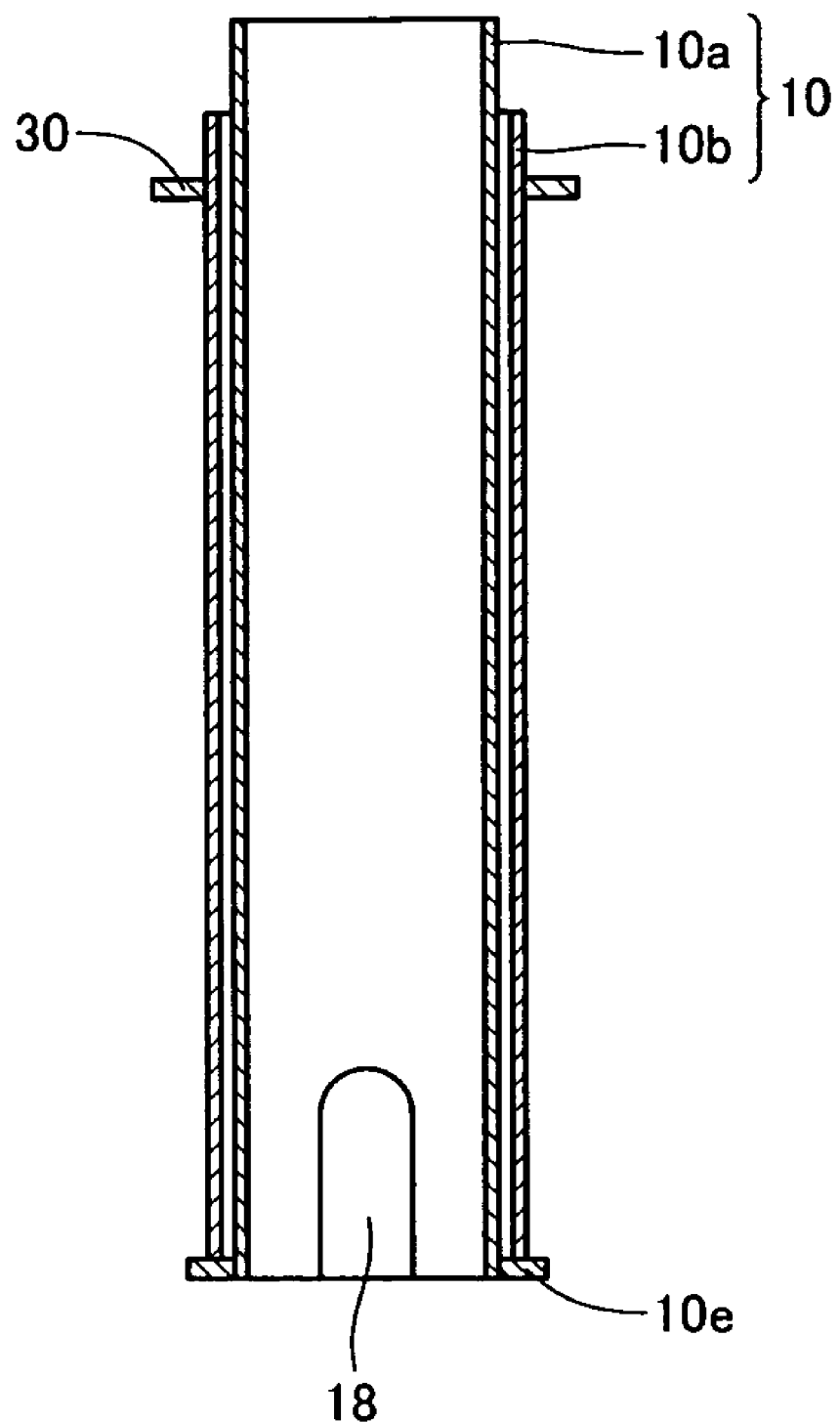
FIG. 5 is a representation of a third structure example of the material vessel to be used in the apparatus for supplying crystalline materials according to the invention.

FIG. 5 is a representation of a third structure example of the material vessel to be used in the apparatus for supplying crystalline materials according to the invention. The material vessel 10 is a cylindrical body having a double structure comprising an inner vessel 10a and an outer vessel 10b, and the inner vessel 10a is inserted into the outer vessel 10b. Both are constituted so that they can slide on each other.

In the third structure example shown in FIG. 5, the outer vessel 10b is constituted of a simple cylindrical body and equipped with a clamping member 30 at the upper part thereof. On the other hand, the lower end portion of the inner vessel 10a is equipped with an inverted U-shaped opening portion 18 for charging the solid material into the crucible, and the lower end circumferential face thereof has a flange portion 10e for supporting the lower end of the outer vessel 10b. Accordingly, the inner vessel 10a is supported by wires (not shown), and the material vessel 10 is thus suspended on the pulling shaft 7.

Figure 6:
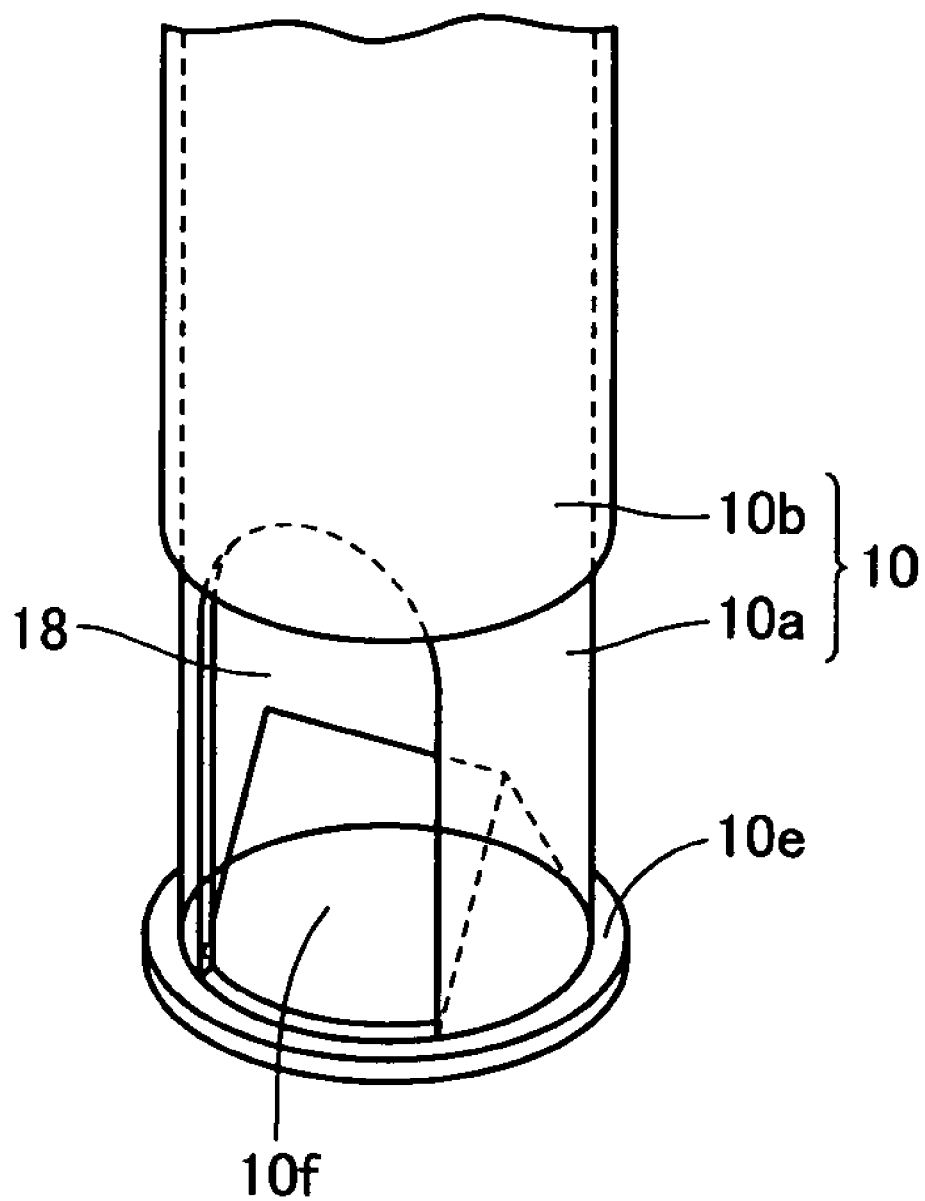
FIG. 6 is a perspective view illustrating the structure of the lower part and bottom of the third structural example of the material vessel to be used in the apparatus for supplying crystalline materials according to the invention.

FIG. 6 is a perspective view illustrating the constitution of the lower part and bottom of the third structure example of the material vessel to be used in the apparatus for supplying crystalline materials according to the invention.

As shown in FIG. 6, the lower part side face of the inner vessel 10a is equipped with an inverted U-shaped opening portion 18, while a charging guide 10f can be disposed on the bottom of the inner vessel. Provision of the charging guide having an inverted V-shape, for instance, makes it possible to prevent any portion of the solid material from remaining on the bottom of the inner vessel 10a on the occasion of charging.

This opening portion 18 has a structure such that it is covered and closed by the outer vessel 10b while the charging of the solid material is not carried out. While the opening portion 18 is closed in such a manner, the inner vessel 10a is filled with the solid material, which is polycrystalline silicon in granular form, through the upper opening 28 of the inner vessel 10a.

In additional charging using the material vessel 10 according to the third structure example shown in FIGS. 5 and 6, the material vessel 10 is lowered and, when the damping member 30 of the outer vessel 10b comes into contact with a small-diameter portion provided on the gate valve 13, the outer vessel 10b alone is stopped from descending. On the other hand, the inner vessel 10a held by the wires 9 is not prevented from descending and, thus, the inner vessel 10a alone further descends while sliding on the inside circumferential face of the outer vessel 10b.

With the sliding motion of the inner vessel 10a, the opening portion 18 of the inner vessel 10a is opened, whereupon the granular solid material 11 in the inner vessel 10a falls under its own weight and is thus added to the molten material 12. On that occasion, the solid material can be inhibited from remaining since the inverted V-shaped charging guide 10f is provided on the bottom of the inner vessel 14a.

Figure 7:
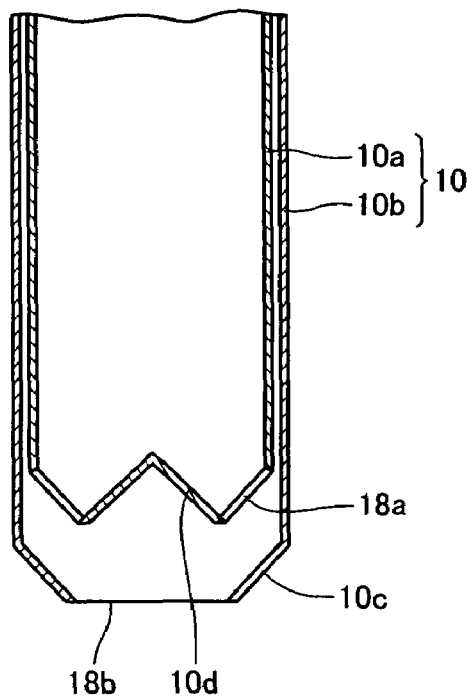
FIG. 7 is a section view showing a fourth structure example of the material vessel to be used in the apparatus for supplying crystalline materials according to the invention.

FIG. 7 is a section view showing a fourth structure example of the material vessel to be used in the apparatus for supplying crystalline materials according to the invention. In the fourth structure example, the material vessel 10 is constituted of a square or rectangular tubular body having a double structure, and the inner vessel 10a is inserted into the outer vessel 10b. Both can slide on each other.

The opening portion 18a on the bottom of the inner vessel 10a is closed by a closing member 10c of the outer vessel 10b. Similarly, the opening portion 18b on the bottom of the outer material vessel 10b is closed by a closing member 10d of the inner vessel 10a. Desirably, the closing member 10d of the inner vessel 10a has an inverted V-shape so that the solid material may be prevented from remaining on the occasion of charging thereof.

For additional charging using the material vessel according to the fourth structure example shown in FIG. 7, the inner vessel 10a is equipped with a clamping member 30 for allowing the outer vessel 10b alone to further slide down from a predetermined height so that the opening portions 18a and 18b may be opened by that sliding motion. Upon this, the granular solid material 11 in the inner vessel 10a falls under its own weight and is thus added to the molten material 12.

Figure 8:
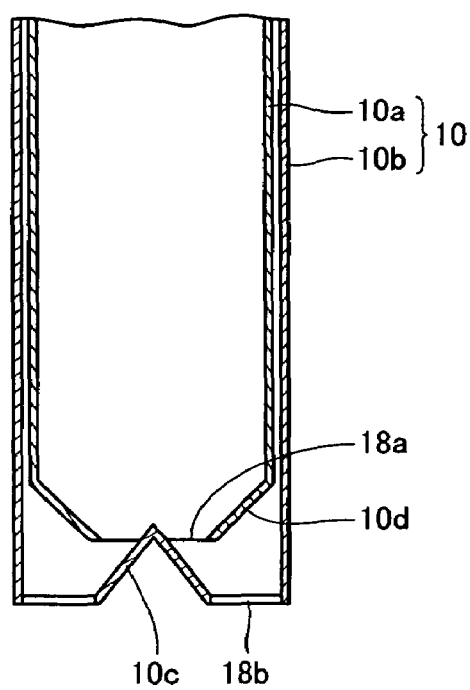
FIG. 8 is a section view showing a fifth structure example of the material vessel to be used in the apparatus for supplying crystalline materials according to the invention.

FIG. 8 is a section view showing a fifth structure example of the material vessel to be used in the apparatus for supplying crystalline materials according to the invention. In the fifth structure example, the material vessel 10 is constituted of a square or rectangular tubular body having a double structure, and the inner vessel 10a is inserted into the outer vessel 10b. Both can slide on each other.

The opening portion 18a on the bottom of the inner vessel 10a is closed by a closing member 10c of the outer vessel 10b. Similarly, the opening portion 18b on the bottom of the outer vessel 10b is closed by a closing member 10d of the inner vessel 10a. Desirably, the closing member 10c of the outer vessel 10b has an inverted V-shape so that the solid material may be prevented from remaining on the occasion of charging thereof.

For additional charging using the material vessel according to the fifth structure example shown in FIG. 8, the inner vessel 10a is equipped with a clamping member 30 for allowing the outer vessel 10b alone to further slide down from a predetermined height, like in the fourth feature example described above, so that the opening portions 18a and 18b may be opened by that sliding motion. Upon this, the granular solid material 11 is added, under its own weight, to the molten material 12.

EXAMPLES

The structure of the material vessel to be used in the apparatus for supplying crystalline materials of present invention as well as the method of supplying crystalline materials using that apparatus is now described more specifically, referring to FIG. 1 to 3. In the growing furnace shown in FIG. 1, a silicon single crystal with a diameter of 8 inches was grown using a crucible 3 having a diameter of 22 inches. In that growing, 100 kg of polycrystalline silicon in a combined form composed of rod-like, lump-like and granular forms was charged as an initial charge into the crucible 3 and, after formation of the molten material 12, additional charging was carried out.

As shown in FIG. 2, the material vessel 10 had a double structure comprising the inner vessel 10a and outer vessel 10b, and the bottom thereof was constituted of the closing members 10c and 10d and had a nearly V-shaped form. The inner vessel 10a was constituted of a cylindrical body made of quartz and had an inside diameter of 160 mm and a length of 1,000 mm. For attaining the bottom structure shown in FIG. 3B, the area proportion of the opening portion 18 on the bottom of the inner vessel 10a was about 63% while the remaining portion was constituted of the closing member 10d and the area proportion thereof was about 37%.

As shown in FIG. 3A, the inner vessel 10a had a bottom shape such that the angle θ of the closing member 10d was about 45 degrees and the distance L between the top of the opening portion 18 and the top of the closing member 10d was about 10 mm. Further, there was a difference in level between the lower end of the closing member 10d and the lower end of the opening portion and, therefore, a vertical wall fixed wall) was provided in that portion. The inner vessel 10a was equipped with the clamping member 30 at the upper circumferential surface thereof.

On the other hand, the outer vessel 10b was constituted of a cylindrical body made of quartz, the inside diameter thereof was greater by about 10 mm than the outside diameter of the inner vessel 10a, and the length thereof was shorter than that of the inner material vessel 10a. Insertion of the inner vessel 10a resulted in a structure such that the clamping member 30 on the inner vessel 10a was supported by the upper end of the outer vessel 10b while the opening portion 18 was closed by the closing member 10c.

The bottom of the outer vessel 10b had a structure suited for closing the opening portion 18 of the inner vessel 10a and the proportion of the area closed thereby amounted to about 38%. The angle β of the closing member 10c was about 45 degrees. The outer vessel 10b had, at the upper part thereof, a plurality of horizontal holes (not shown) for passing the suspending wires 9 through.

Then, the inner vessel 10a was filled with 20 kg of a granular solid material 11 with a grain size of 5 mm to 25 mm while the opening portion 18 was closed by the closing member 10c.

After completion of the melting of the solid material 11 initially charged, the material vessel 10 containing the solid material 11 was suspended on the pulling shaft 7 using the hanger 8 for exclusive use through the intermediary of a plurality of wires 9 and then positioned above the crucible 3. On that occasion, the outer vessel 10b was supported by the plurality of wires 9, and the inner vessel 10a was supported by the clamping member 30 in the manner of being embraced by the outer vessel 10b.

As the pulling shaft 7 was driven, the material vessel 10 descended to a predetermined height level and, when the clamping member 30 came into contact with the gate valve 13, the inner vessel 10a stopped descending while the outer vessel 10b further slid down by 30 mm to 35 mm and thereby opened the opening portion 18 to allow the solid material 11 to be fed to the crucible 3.

As the material was continuously fed, the initially charged molten material 12 in the crucible 3 was cooled and the melt surface solidified. The outer material vessel 10b was further allowed to descend by 10 mm to 15 mm, and all the material remaining therein was thus fed to the crucible 3. During the above procedure, the crucible was rotated at 10 rpm.

After completion of the feeding, the material vessel 10 was taken out of the chamber. The solid material 11 fed to the crucible 3 was heated by the heater 5 and formed a molten material to successfully make up for the melt quantity deficiency. In the apparatus for supplying crystalline materials according to the invention, the lower end of the material vessel 10 may be provided with a cover 17. In this manner, the deviation in charging position could be eliminated and the molten material could be prevented from splashing on the heater 5 and other parts.

As described hereinabove, the additional charging using the material vessel for the apparatus for supplying crystalline materials according to the invention uses granular polycrystalline silicon as the solid material and, therefore, the material cost is low and there is no risk of cracking due to rapid heating. Furthermore, the splashing of the molten material on the occasion of additional charging can be prevented.

What is claimed is:

1. An apparatus for supplying crystalline materials in the Czochralski method which is equipped with an inner vessel having an opening portion at the lower part or bottom thereof, which is to be charged with a granular solid material, an outer vessel containing the inner vessel with the function of sliding movement therein and thus closing said opening portion, and pull-up means for suspending the inner vessel and outer vessel in a manner causing them to ascend or descend, wherein said opening portion is opened through a sliding motion of the inner vessel or outer vessel for additional charging or recharging of the solid material into the molten material in the crucible.

2. An apparatus for supplying crystalline materials in the Czochralski method as claimed in claim 1, wherein the inner vessel is equipped with a clamping member for stopping the ascending or descending thereof and the opening portion of the inner vessel is opened through a sliding motion of the outer vessel.

3. An apparatus for supplying crystalline materials in the Czochralski method as claimed in claim 1, wherein the outer vessel is equipped with a clamping member for stopping the ascending or descending thereof and the opening portion of the inner vessel is opened through a sliding motion of the inner vessel.

4. An apparatus for supplying crystalline materials in the Czochralski method as claimed in claim 1, wherein the material constituting the inner vessel and outer vessel is quartz, silicon carbide (SiC), or carbon coated with SiC.

5. An apparatus for supplying crystalline materials in the Czochralski method as claimed in claim 2, wherein the material constituting the inner vessel and outer vessel is quartz, silicon carbide (SiC), or carbon coated with SiC.

6. An apparatus for supplying crystalline materials in the Czochralski method as claimed in claim 3, wherein the material constituting the inner vessel and outer vessel is quartz, silicon carbide (SiC), or carbon coated with SiC.

7. A method of supplying crystalline materials in the Czochralski method which comprises:

the step of inserting an inner vessel having an opening portion at the lower part or bottom thereof with the function of sliding movement into an outer vessel and charging the inner vessel with a granular solid material while said opening portion is closed, the step of suspending the inner vessel and outer vessel and causing them to descend until above a crucible located in the center of a growing furnace, the step of stopping the descending of either of the inner vessel and outer vessel to thereby allow either of the inner vessel and outer vessel to further slide, and the step of opening the above-mentioned opening portion through the sliding motion of the inner vessel or outer vessel and thereby additionally charging or recharging the solid material into the molten material in the crucible.

8. A method of supplying crystalline materials in the Czochralski method as claimed in claim 7, wherein the inner vessel is equipped with a clamping member for stopping the descending thereof so that the opening portion of the inner vessel may be opened through a sliding motion of the outer vessel to allow additional charging or recharging of the solid material into the molten material in the crucible.

9. A method of supplying crystalline materials in the Czochralski method as claimed in claim 7, wherein the outer vessel is equipped with a clamping member for stopping the descending thereof so that the opening portion of the inner vessel may be opened through a sliding motion of the inner vessel to allow additional charging or recharging of the solid material into the molten material in the crucible.

10. A method of supplying crystalline materials in the Czochralski method as claimed in claim 7, wherein the granular solid material to be charged into the inner vessel to constitute a lower layer portion close to the opening portion is a fine-granule material with a grain size of not larger than 25 mm.

11. A method of supplying crystalline materials in the Czochralski method as claimed in claim 7, wherein the solid material is additionally charged or recharged into the molten material in the crucible while the crucible is rotated.

12. A method of supplying crystalline materials in the Czochralski method as claimed in claim 8, wherein the solid material is additionally charged or recharged into the molten material in the crucible while the crucible is rotated.

13. A method of supplying crystalline materials in the Czochralski method as claimed in claim 9, wherein the solid material is additionally charged or recharged into the molten material in the crucible while the crucible is rotated.

* * * * *